United States Patent
Preuschl (10) Patent No.: US 8,998,450 B2
(45) Date of Patent: Apr. 7, 2015

(54) BENDABLE LUMINOUS MODULES AND METHOD FOR PRODUCING BENDABLE LUMINOUS MODULES

(75) Inventor: Thomas Preuschl, Sinzing (DE)

(73) Assignee: OSRAM GmbH, Munich (DE)

( * ) Notice: Subject to any disclaimer, the term of this patent is extended or adjusted under 35 U.S.C. 154(b) by 360 days.

(21) Appl. No.: 13/384,541

(22) PCT Filed: Jun. 16, 2010

(86) PCT No.: PCT/EP2010/058475
§ 371 (c)(1),
(2), (4) Date: Jan. 17, 2012

(87) PCT Pub. No.: WO2011/006725
PCT Pub. Date: Jan. 20, 2011

(65) Prior Publication Data
US 2012/0113606 A1    May 10, 2012

(30) Foreign Application Priority Data
Jul. 14, 2009    (DE) .......................... 10 2009 032 984

(51) Int. Cl.
*F21S 4/00* (2006.01)
*F21V 21/14* (2006.01)
*H05K 1/03* (2006.01)
(Continued)

(52) U.S. Cl.
CPC ........... *H05K 1/189* (2013.01); *F21Y 2111/001* (2013.01); *H05K 2201/056* (2013.01); *H05K 2201/058* (2013.01); *F21S 8/08* (2013.01); *F21W 2131/103* (2013.01); *F21Y 2101/02* (2013.01); *H05K 1/0203* (2013.01); *H05K 1/0278* (2013.01); *H05K 1/028* (2013.01); *H05K 3/0061* (2013.01); *H05K 2201/09063* (2013.01); *H05K 2201/09254* (2013.01); *H05K 2201/0969* (2013.01); *H05K 2201/10106* (2013.01)

(58) Field of Classification Search
CPC ... H05K 1/0277; H05K 1/0278; H05K 1/028; H05K 1/0281; H05K 3/0058; H05K 3/0061; H05K 2201/056; H05K 2201/058; H05K 2201/061; H05K 2201/0969; F21Y 2103/003; F21Y 2105/001; F21Y 2111/001
USPC ............. 362/249.04, 249.09, 249.02, 249.08; 361/749, 750, 751; 174/254, 255, 260; 29/831
See application file for complete search history.

(56) References Cited

U.S. PATENT DOCUMENTS 7,075,794 B2 * 7/2006 Gall et al. ..................... 361/749
7,443,678 B2 * 10/2008 Han et al. ..................... 361/704
(Continued)

FOREIGN PATENT DOCUMENTS

| DE | 35 15 549 | 10/1986 |
|---|---|---|
| DE | 20 2007 018 552 | 10/2008 |
| FR | 2 871 334 | 12/2005 |

*Primary Examiner* — Alan Cariaso
(74) *Attorney, Agent, or Firm* — Cozen O'Connnor (57) ABSTRACT

A light module (1; 14), comprising a carrier (8, 10) for mounting at least one semiconductor source (5), in particular a light emitting diode, wherein: the carrier (8, 10) has a flexible printed circuit board (10), the flexible printed circuit board (10) is bonded face-to face to at least one base plate, (8) and the carrier (8, 10) can be bent along at least one predetermined bending line (3; 3a-3e), the base plate (8) can be bent along the at least one bending line, (3; 3a-3e), the base plate (8) has at least one cutout (9) along the bending line (3; 3a-3e) and the flexible printed circuit board (10) has at least one strip (11; 15) which crosses at least one of the cutouts (9).

18 Claims, 6 Drawing Sheets

(51) Int. Cl.
    *H05K 3/20*     (2006.01)
    *H05K 1/18*     (2006.01)
    *F21Y 111/00*     (2006.01)
    *F21S 8/08*     (2006.01)
    *F21W 131/103*     (2006.01)
    *F21Y 101/02*     (2006.01)
    *H05K 1/02*     (2006.01)
    *H05K 3/00*     (2006.01)

(56) References Cited

U.S. PATENT DOCUMENTS

| | | | |
|---|---|---|---|
| 8,000,105 B2 * | 8/2011 | Hinkle | 361/749 |
| 8,283,565 B2 * | 10/2012 | Yagisawa et al. | 174/254 |
| 2005/0056457 A1 | 3/2005 | Gall et al. | |
| 2006/0225914 A1 | 10/2006 | Tan | |
| 2007/0281499 A1 | 12/2007 | Muro et al. | |

\* cited by examiner

BENDABLE LUMINOUS MODULES AND METHOD FOR PRODUCING BENDABLE LUMINOUS MODULES

RELATED APPLICATIONS

This is a U.S. national stage of application No. PCT/EP2010/058475, filed on Jun. 16, 2010.

This application claims the priority of German application no. 10 2009 032 984.6 filed Jul. 14, 2009, the entire content of which is hereby incorporated by reference.

FIELD OF THE INVENTION

The invention relates to light modules with a carrier for mounting at least one semiconductor source, wherein the carrier has a flexible printed circuit board, the flexible printed circuit board is bonded face-to-face to at least one base plate, and the carrier can be bent along at least one predetermined bending line. The invention also relates to a method for producing such light modules.

BACKGROUND OF THE INVENTION

A hitherto known light module of the above mentioned type is an LED module with a rigid-flex carrier wherein a plurality of rigid base plates are mounted spaced apart on a highly flexible printed circuit board. The flexible printed circuit board can be bent along the space between two adjacent base plates. The disadvantage of the rigid-flex carrier is that the bending is not precisely adjustable and is also insufficiently stable for the majority of applications. However, stabilization of the bending by means of additional mechanical fastening is expensive in terms of material and assembly costs.

SUMMARY OF THE INVENTION

The object of the present invention is to avoid the above mentioned disadvantages and in particular provide an inexpensive means of bending a light module in a stable manner in terms of material and manufacturing costs.

The object is achieved in accordance with one aspect of the present invention directed to a light module having a carrier for mounting at least one semiconductor source, in particular a light emitting diode, wherein the carrier has a flexible printed circuit board, the flexible printed circuit board is bonded face-to-face to at least one base plate, and the carrier can be bent along at least one predetermined bending line.

In addition, the base plate can be bent along the at least one bending line. This means that not only the flexible printed circuit board but also the base plate can be bent along the bending line, thereby providing more precise adjustability and better shape retention along the bending line. The bending stability can be precisely adjusted and maintained in particular by means of an essentially plastically deforming material such as a metal.

In addition, the base plate has at least one cutout or window on the bending line, and the flexible printed circuit board has at least one strip which crosses one of the at least one cutouts.

In other words, the base plate has, along the bending line, at least one cutout, and at least one of the one or more cutouts is crossed by means of at least one strip. In particular, the strip runs at least in sections completely over the cutout, i.e. the width of the strip over the cutout is equal to or preferably less than the width of the cutout. Consequently, the cutout is not covered by the strip at the sides of the strip, but left open.

Through the combination of cutout and strip, when the carrier is bent along the associated bending line containing the cutout and crossed by the strip, the base plate will bend, carrying the strip with it. However, as the cutout is present, the strip is not bent on the base plate and is not therefore overflexed. Instead, the strip sinks into the cutout in which it can run essentially in a straight line, thereby reducing any straining (including compression) of the strip. The reduction in strain in turn provides an improved production yield and/or reduced failure probability, i.e. higher reliability. In other words, the cutouts ensure that differential elongation of the flexible printed circuit board and base plate is compensated, thereby preventing or at least considerably reducing tensile stress or, depending on the direction of bending, compressive stress.

All in all, this enables a simple bendable light module to be provided which permits precise and stable bending without additional tools or material. The bending can even be carried out in the field or on the end customer's premises. The probability of bending-induced strip failure is low.

Bending along different bending lines can be at different bending angles.

The semiconductor source preferably comprises at least one light emitting diode. The at least one light emitting diode can be present as one or more individual LEDs or as one or more groups of LEDs or LED chips mounted on a common substrate (LED clusters). The LEDs or LED chips can be single or multicolor emitting, e.g. white. For example, an LED cluster can have a plurality of individual LEDs or LED chips which can together produce a white mixed light, e.g. in 'cold white' or 'warm white'. To produce a white mixed light, the LED cluster preferably comprises LEDs or LED chips which emit in the primary colors red (R), green (G) and blue (B). Individual colors or a plurality of colors can also be produced simultaneously by a plurality of LEDs or LED chips, thus making possible such combinations as RGB, RRGB, RGGB, RGBB, RGGBB, etc. However, the color combination is not limited to R, G and B. For example, to produce a warm white color, one or more amber (A) LEDs or mint (M) LEDs can also be present. In the case of LEDs or LED chips with different colors, these can also be controlled such that the LED module emits in a tunable RGB color range. An LED cluster can also comprise a plurality of white LEDs or LED chips, thereby enabling simple luminous flux scalability to be achieved. Individual chips and/or LED clusters can be equipped with suitable optical systems for beam guidance, e.g. Fresnel lenses, collimators, and so on. Instead of or in addition to inorganic light emitting diodes, e.g. based on InGaN or AlInGaP, organic LEDs (OLEDs) can also generally be used. Diode lasers, for example, can also be used as semiconductor sources.

In general, the flexible printed circuit board can be populated with light sources, optical mounts and/or optical systems and/or electronic components, power sources, etc. In particular, the flexible printed circuit board can also be populated with a driver circuit or part of a driver circuit. The driver circuit can be implemented using a single component or a plurality of components. The driver circuit can be operated, for example, from a low voltage (e.g. a voltage of 60 VDC or less, in particular 24 VDC or less) and also from a higher voltage, e.g. a line voltage of between 220 and 230 VAC. For this purpose, the driver circuit can have at least one voltage converter, e.g. a rectifier and/or a DC/DC converter. However, the at least one converter can also be implemented separately from the driver circuit.

In one embodiment, the cutout is a central cutout, i.e. completely surrounded laterally by the base plate material. This has the advantage of greater stability and anti-tilt protection.

In another embodiment, the cutout is a lateral cutout. This can be more easily made in the base plate than a central cutout.

In yet another embodiment, the strip is domed upward at least over the respective cutout. This domed strip can be produced e.g. by the so-called 'bookbinding method'. When the carrier is bent along a bending line, the effect of the arching of the strip is that the strip is strained even less or not at all, thereby reducing still further the probability of failure.

The basic material or backing material of the flexible printed circuit board preferably consists of PI, but is not limited thereto. PI provides very good electrical insulation, thereby enabling the live parts of the populated carrier (LEDs, traces, etc.) to be very well electrically isolated from the base plate. As an alternative to PI, for example PET or PEN can also be used as the basic material.

The object is also achieved in accordance with another aspect of the present invention directed to a light module having a carrier for mounting at least one semiconductor source, in particular a light emitting diode, wherein the carrier has a flexible printed circuit board, the flexible printed circuit board is bonded face-to-face to at least one base plate, and the carrier can be bent along at least one predetermined bending line.

In addition, the base plate can be bent along the at least one bending line, and the flexible printed circuit board overarches the associated bending line. The overarching means that, in the domed region, the flexible printed circuit board is raised from the base plate and is therefore spaced apart therefrom. Said printed circuit board does not require a cutout, which simplifies printed circuit board manufacture. Instead, when it is bent along the bending line, the overarching part of the flexible printed circuit board is pulled apart, but no overflexing occurs, as the spare length inherent in the domed shape prevents this.

The printed circuit board can have both a combination of cutout(s) and strip(s) and a domed shape without cutout.

The light module need not be provided with a prefabricated nominal bending line. Instead, the bending can be carried out by freely creatable bending along the bending line required, e.g. by placing the carrier on an edge of a base in an appropriately oriented manner and bending the carrier along the edge.

However, in a preferred development of the two light modules, the base plate is designed for bending along the at least one bending line of the carrier. This produces a particularly precisely positioned bending line as well as a high degree of bending reproducibility.

In a specific development, the base plate has a thinning of material along the at least one bending line, e.g. a longitudinal slot or other recess, thereby providing a simple means of defining the bending line. The recess can also be produced such that the base plate is constructed as a stack of layers wherein a corresponding recess is present in one or more outer layers or the outer layer(s) is/are applied as two mutually spaced apart sub-layers in each case.

The recess is preferably on the side (back side) of the base plate facing away from the flexible printed circuit board.

In another development, the base plate consists of a plastically deformable material with good thermal conductivity, in particular aluminum. As a result of the plastic deformation with as small an elastic component as possible, springback which may affect bending accuracy can be prevented. Metals are typically suitable as plastic materials. As a result of the good conduction of heat, for which e.g. a thermal conductivity $\lambda$ of more than 100 W/(m·K), specifically more than approximately 180 W/(m·K), can be assumed, the base plate can also be used as a heat spreading element and/or a heat sink, thereby obviating the need for a separate heat sink.

In a specific development, the base plate has a thickness of at least 0.5 mm in order to allow a sufficient thermal flux.

In another specific development, the base plate has at least one cooling projection, in particular a cooling fin or stud, in order to assist heat dissipation to ambient.

In another development, the flexible printed circuit board is provided with at least one RA (rolled anneal) copper trace, said RA copper trace crossing the at least one bending line. The advantage of RA copper over ED (electrodeposited) copper, which can generally also be used, is that the RA copper is comparatively more ductile and therefore has a later tearing or breaking point when subjected to stress. This further reduces the failure probability.

The object is also achieved in accordance with another aspect of the present invention directed to a method for producing a light module having a combination of strip and cutout, said method consisting of laminating the flexible printed circuit board face-to-face onto the planar base plate. The laminating can be carried out by means of cold pressure or hot pressure.

The flexible printed circuit board and the base plate are flat, i.e. planar, so that lamination be performed simply and without inclusions. The resulting carrier is then likewise a flat, i.e. planar, component.

The object is also achieved in accordance with another aspect of the present invention directed to a method for producing a light module with a printed circuit board overarching a bending line, said method consisting of laminating the flexible printed circuit board face-to-face onto the in particular planar base plate, except in at least one region above the at least one bending line, and arching the flexible printed circuit board over the at least one bending line in the at least one region.

The arching of the printed circuit board can be carried out, for example, using the bookbinding method whereby surplus flexible PCB material is provided at least over the bending line, said material being at least partially used up again during bending.

In an embodiment for both methods, the operation following the laminating step consists of populating the flexible printed circuit board. This can take place in the still unbent, in particular flat state of the carrier and therefore of the printed circuit board using conventional PCB pick and place equipment. In addition, component placement is carried out on a one-piece item in terms of placement which further simplifies the process.

The printed circuit board can basically be populated with light sources, optical mounts and/or optical systems and/or electronic components, power sources, etc. Thus, for example, optical mounts can be for example adhesively mounted on the carrier or rather on the printed circuit boards. Optical elements such as lenses can then be inserted in the holders.

In yet another embodiment, the operation following the step of component placement consists of bending the light module along at least one bending line. The light module can therefore be bent in the already fully populated state.

Following the component placement step or following the bending step, the light module can be assembled e.g. by screwing or clamping.

The invention will be described in more detail in the following schematics with reference to exemplary embodiments. For the sake of clarity, elements that are identical or have the same effect are provided with the same reference characters.

Figure 1:
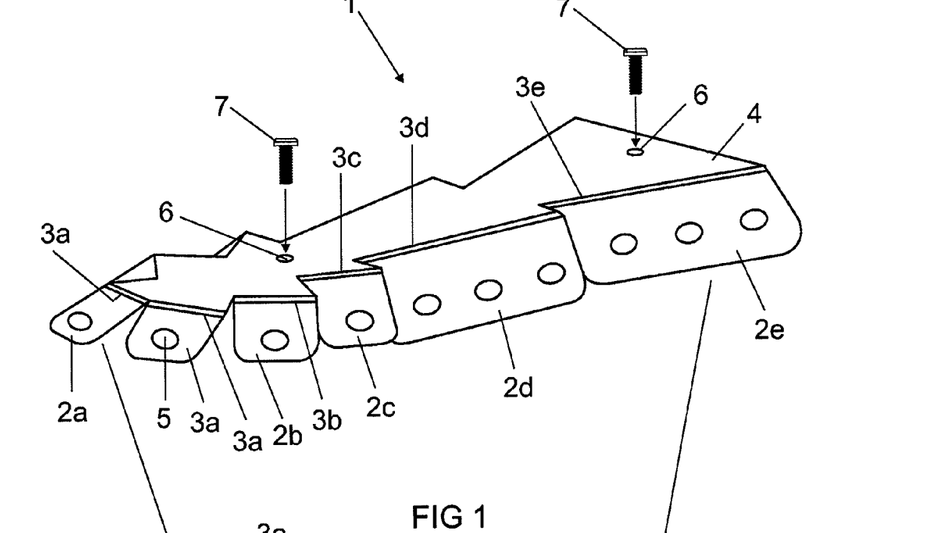
FIG. 1 shows an oblique view of a bent light module.

FIG. 1 shows an oblique view of a bent light module 1. The light module 1 has on each side five tab-shaped regions 2a to 2e which are bent along a respective bending line 3a to 3e from a central region 4. One or more light emitting diodes 5 are mounted on each of the tab-shaped regions 2a to 2e. The light module 1 can be screwed to the desired lamp, e.g. a streetlight, by means of two screw holes 6 and screws 7. Traces, electrical terminals and other electronic components (e.g. a driver circuit) are not shown merely for the sake of clarity, but can be present.

Figure 2:
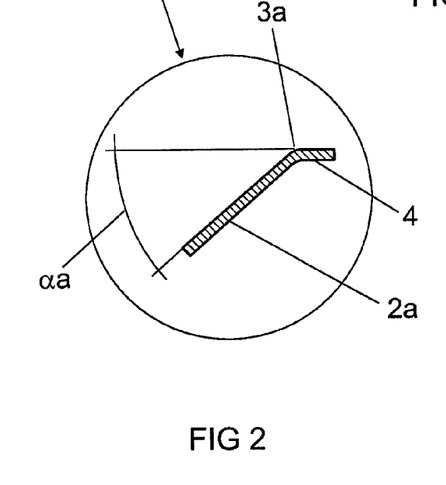
FIG. 2 shows a cross-sectional side view of a detail of the light module in a bending region.
Figure 3:
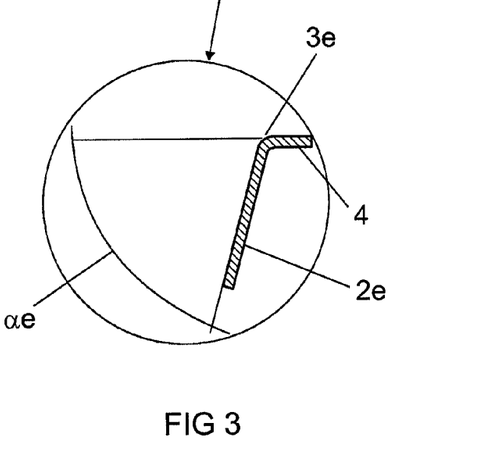
FIG. 3 shows a cross-sectional side view of a detail of the light module in a region of further bending.

As (a) the bending lines 3a to 3e are differently oriented, (b) the number of light emitting diodes 5 on the tab-shaped regions 2a to 2e can be different (frontmost tab-shaped region 2a: one light emitting diode 5 and rearmost tab-shaped region 2e: three light emitting diodes), and (c), as shown for the frontmost tab-shaped region 2a in FIG. 2 and the rearmost tab-shaped region 2e in FIG. 3, the associated bending angles αa and αe respectively of the tab-shaped regions 2a to 2e can be different, a highly differentiated and complex radiation characteristic can be achieved.

In order to enable it to assume such a complex bent shape without great expense and with a high degree of reliability, the light module 1 has at least two layers, namely a lower base plate and an upper flexible printed circuit board, as will be explained in greater detail below.

Figure 4:
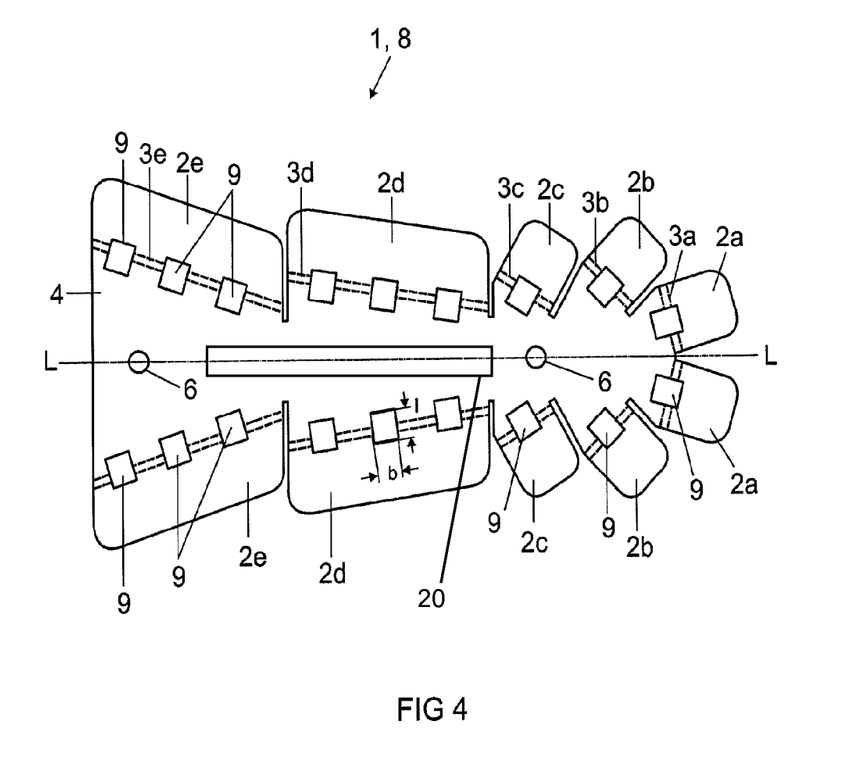
FIG. 4 shows a top view of a base plate of the light module.

FIG. 4 shows a top view of a planar base plate 8 of the light module 1 prior to bending, said base plate being axially symmetrical with respect to a longitudinal axis L. The base plate 8 is made of aluminum of more than 0.5 mm thickness. The bending lines 3a to 3e which demarcate the central region 4 from the tab-shaped regions 2a to 2e of the base plate 8 are implemented as straight-line backside thinnings of material in the form of recesses. The base plate 8 is therefore bendable in a defined manner along the bending lines 3a to 3e, namely in an essentially plastic manner.

In the region of the bending lines 3a to 3e, the base plate 8 has central rectangular cutouts 9 of length l and width b, namely one cutout 9 for each light emitting diode provided. The cutouts 9 therefore interrupt the bending lines 3a to 3e. The screw holes 6 are disposed on the longitudinal axis L.

Figure 5:
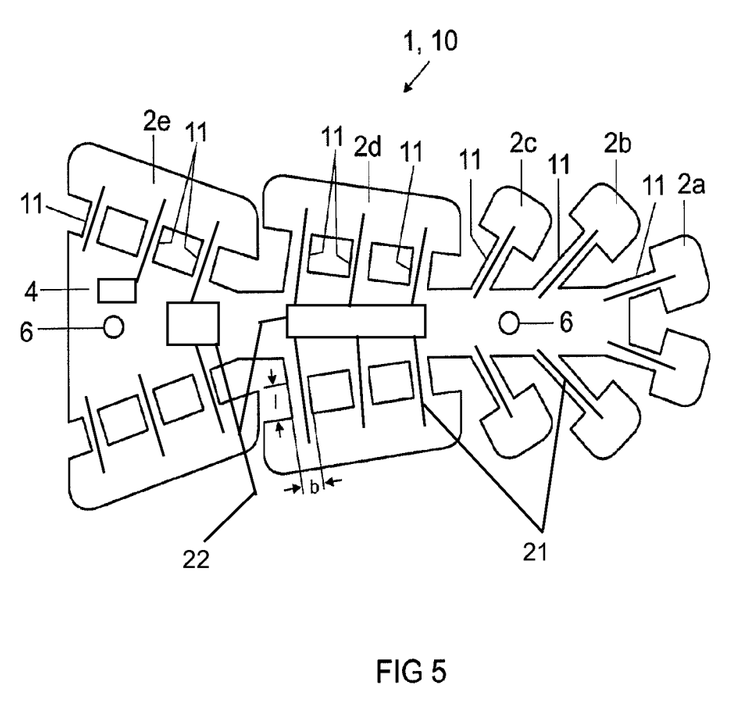
FIG. 5 shows a top view of a flexible printed circuit board of the light module.

FIG. 5 shows a plan view onto the top of a flexible printed circuit board 10 of the light module 1. The flexible printed circuit board 10 consists of a basic material of PI, on top of which RA copper traces 21 are provided. The back side is used for face-to face mounting on the base plate 8 from FIG. 4. The outer contour of the flexible printed circuit board 10 does not extend beyond the outer contour of the base plate 8.

More precisely, the outer contour of the flexible printed circuit board 10 corresponds to the outer contour of the base plate 8 except in the region of the bending lines 3a to 3e. There, at the point where the cutouts 9 are provided in the base plate 8, the flexible printed circuit board 10 has strips 11 which have the same length as, or a somewhat greater length l than, the cutouts 9. However, the width b of the strips 11 is less than the width b of the cutouts 9.

Provided on each of the tab-shaped regions 2a to 2e of the flexible printed circuit board 10 are placement positions (not shown) for a respective light emitting diode, the associated RA copper leads 21 (to the power supply, etc. 22) for a placement position being routed via the associated strip 11.

Figure 6:
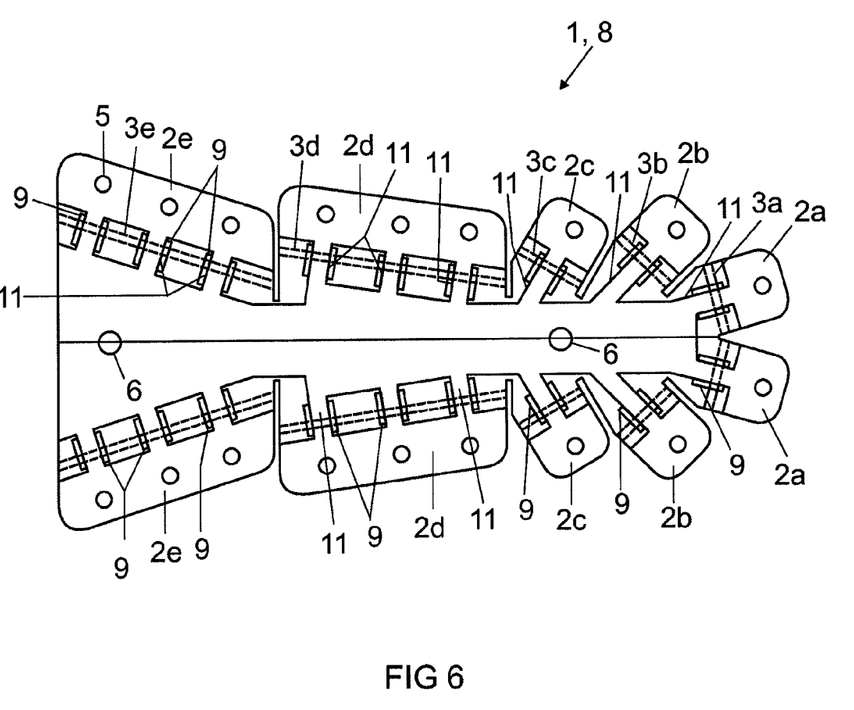
FIG. 6 shows a top view of the light module as a combination of the base plate and the flexible printed circuit board mounted thereon.

FIG. 6 shows the light module 1 as a combination of the base plate 8 and the flexible printed circuit board 10 laminated onto it. The flexible printed circuit board 10 is now shown populated with the light emitting diodes 5.

The strips 11 run across the cutouts 9 such that the cutouts 9 remain slightly free to the left and right of the strips 11.

This ensures that, during bending, the strips 11 do not catch laterally on the base plate 8 and tear, but when bent along the associated bending line can sink freely into the associated cutout 9.

Figure 7:
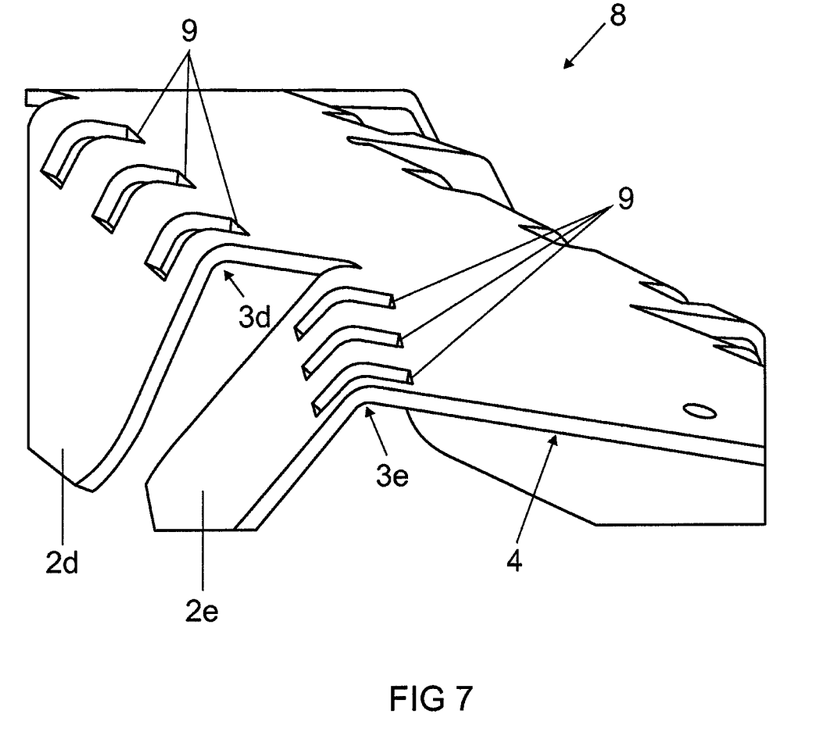
FIG. 7 shows an oblique view of a section of the bent base plate from FIG. 4.

The shape of the base plate 8 when bent along the bending lines 3a to 3e is further illustrated in FIG. 7. In the bent-down state here, the cutouts 9 also have an at least partly bent shape. The tab-shaped regions 2d to 2e of the base plate 8 remain flat, as does the central region 4.

Figure 8:
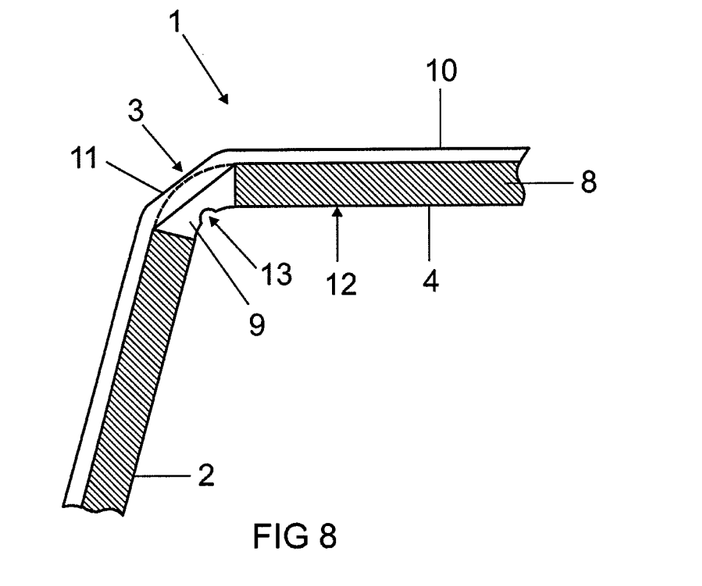
FIG. 8 shows a cross-sectional side view similar to FIG. 3 of a detail of the bent light module.

FIG. 8 shows a cross-sectional side view of a detail of the bent light module 1 in the region of one of the bending lines 3. The associated tab-shaped region 2 is bent down by a defined angle along the bending line 3. For positionally accurate adherence to the bending line 3, the base plate 8 has an oblong recess 13 on its underside 12.

The bending accuracy and stability are determined by the essentially plastically deformable base plate 8. In order to prevent overflexing (in the direction of tension or compression) of the printed circuit board 10 and in particular of the traces running thereon, the printed circuit board 10 extends over the cutout 9 as a strip 11. During bending, the strip 11 sinks into the cutout, thereby considerably reducing the stress exerted on the strip 11 compared to stress without the cutout 9. The strip 11 can in fact run in a straight line between the edges of the cutout 9 and does not need to follow the bent upper side of the base plate 8. A small amount of stress is tolerable, particularly if the comparatively ductile RA copper traces are used.

Figure 9:
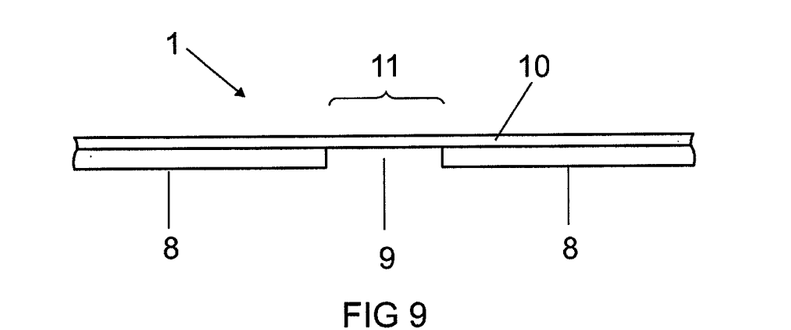
FIG. 9 shows a cross-sectional side view of a detail of the unbent light module in the region of a combination of a strip and a cutout.

FIG. 9 shows a cross-sectional side view of a detail of the unbent light module 1 in the region of a combination of one of the strips 11 and one of the cutouts 9. The flexible printed circuit board 10 is mounted on the base plate 8 in an essentially planar manner here, i.e. both the upper side of the base plate and the flexible printed circuit board 10 are essentially flat and also applied face-to-face to one another. Prior to bending, the strip 11 is therefore also essentially flat above the cutout 9. Such a bringing together of base plate 8 and printed circuit board 10 is therefore particularly easy to implement.

Figure 10:
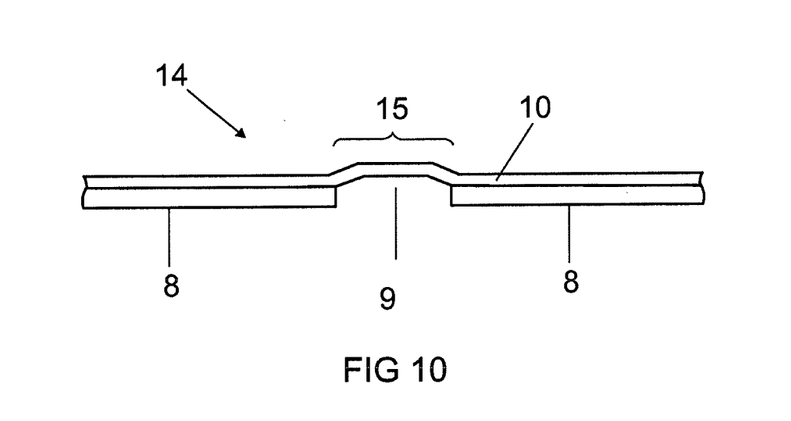
FIG. 10 shows a cross-sectional side view of a detail of another unbent light module in the region of cutout with an alternative combination of a strip and a cutout.

FIG. 10 shows a cross-sectional side view of a detail of another unbent light module 14 in the region of a cutout 9 of the base plate 8 with an alternative shaping of the strip 15.

Instead of running flat over the cutout 9, the domed strip 15 now arches over the cutout 9. As a result, the strip 15 has more material than the flat strip 11, which means that during bending the domed strip 15 is first deformed, in particular straightened, before it is flexed, thereby providing even better protection against overflexing. With a domed strip 15, no cutout 9 is necessary for overflexing protection, although a combination of domed strip 15 and cutout 9 produces a particularly reliable design.

The present invention is obviously not limited to the exemplary embodiments shown.

For example, the base plate can have, particularly on the back side, at least one cooling projection, in particular a cooling fin or stud 20 (shown in FIG. 4).

In addition or alternatively, the base plate can also have at least one lateral cutout.

Instead of an individual LED, an LED cluster or a laser diode, for example, can also be used.

LIST OF REFERENCE CHARACTERS 1 light module
2 tab-shaped region
2a-2e tab-shaped region
3 bending line
3a-3e bending line
4 central region
5 light emitting diode
6 screw hole
7 screw
8 base plate
9 cutout
10 flexible printed circuit board
11 strip
12 underside of base plate
13 recess
14 light module
15 domed strip

The invention claimed is:

1. A light module comprising:
a plurality of semiconductor light sources; and
an elongated carrier comprising:
an elongated base plate capable of being bent along a plurality of bending lines, the bending lines being positioned symmetrically along a length of the elongated base plate on both sides of a longitudinal axis of the elongated base plate, the elongated base plate being shaped so as to form a plurality of tab-shaped regions, each tab-shaped region being located on a side of a respective bending line away from the longitudinal axis and with an edge thereof being along one bending line, the plurality of bending lines not being aligned with one another, the elongated base plate having a plurality of cutouts, at least one cutout being located along each bending line; and
an elongated flexible printed circuit board bonded face-to-face to the elongated base plate, the elongated flexible printed circuit board being shaped so as to form a plurality of tab-shaped regions, each tab-shaped region of the elongated flexible printed circuit board coinciding with and bonded to a single tab-shaped region of the elongated base plate, at least one semiconductor light source being mounted to each tab-shaped region of the elongated flexible printed circuit board, the printed circuit board having a plurality of strips, a first end of each strip being connected to a respective single tab-shaped region of the elongated flexible printed circuit board on a first side of a respective bending line, a second end of each strip being positioned on a second side of the respective bending line closest to the longitudinal axis so that the strip crosses one of the cutouts perpendicular to the respective bending line, each strip being capable of being bent along the respective bending line.

2. The light module of claim 1, wherein the cutouts are located in a central longitudinal region of the elongated base plate.

3. The light module of claim 1, wherein the cutouts are located in an end region of the elongated base plate.

4. The light module of claim 1, wherein each strip is domed over a respective cutout and along the respective bending line.

5. The light module of claim 1, wherein the elongated base plate is configured for bending along each bending line.

6. The light module of claim 5, wherein the elongated base plate has a thinning of material along each bending line.

7. The light module of claim 1, wherein the elongated base plate is comprised of a thermally conductive and plastically deformable material.

8. The light module of claim 7, wherein the elongated base plate has at least one cooling projection.

9. The light module of claim 7, wherein the elongated base plate has at least one cooling fin.

10. The light module of claim 1, wherein the elongated base plate has a thickness of at least 0.5 mm.

11. The light module of claim 1, wherein the elongated flexible printed circuit board is provided with a plurality of RA copper traces, each RA copper trace on a respective strip crossing a respective bending line and electrically connected to a semiconductor light source mounted to the respective tab-shaped region of the elongated flexible printed circuit board.

12. The light module of claim 1, wherein the elongated base plate is comprised of aluminum.

13. A method for producing a light module comprising:
forming an elongated base plate capable of being bent along a plurality of bending lines, the bending lines being positioned symmetrically along a length of the elongated base plate on both sides of a longitudinal axis of the elongated base plate, the elongated base plate being shaped so as to form a plurality of tab-shaped regions, each tab-shaped region being located on a side of a respective bending line away from the longitudinal axis and with an edge thereof being along one bending line, the plurality of bending lines not being aligned with one another, the elongated base plate having a plurality of cutouts, at least one cutout being located along each bending line;
forming an elongated flexible printed circuit shaped so as to form a plurality of tab-shaped regions, each tab-shaped region of the elongated flexible printed circuit board shaped to coincide with a single tab-shaped region of the elongated base plate, the printed circuit board having a plurality of strips, a first end of each strip being connected to a respective single tab-shaped region of the elongated flexible printed circuit board on a first side of a respective bending line, a second end of each strip being positioned on a second side of the respective bending line closest to the longitudinal axis so that the strip crosses one of the cutouts perpendicular to the respective bending line, each strip being capable of being bent along the respective bending line;
laminating the elongated flexible printed circuit board face-to-face onto the elongated base plate so that each tab-shaped region of the elongated flexible printed circuit board coincides with a single tab-shaped region of the elongated base plate; and mounting at least one semiconductor light source to each tab-shaped region of the elongated flexible printed circuit board.

14. The method for producing a light module of claim 13, wherein the elongated flexible printed circuit board is not laminated face-to-face onto the elongated base plate in at least one region above the bending lines, and further comprising:

arching the strips over their respective bending line in the at least one region.

15. The method of claim 14, wherein the elongated base plate is flat.

16. The method of claim 13, further comprising, following the laminating step:

populating the elongated flexible printed circuit board with an electronic component.

17. The method of claim 16, further comprising, following the populating step:

bending the light module along at least one bending line.

18. The method of claim 13, wherein the elongated base plate is flat.

* * * * *